(12) United States Patent
Cho et al.

(10) Patent No.: US 12,727,474 B2
(45) Date of Patent: Sep. 1, 2026

(54) SEMICONDUCTOR PACKAGE

(71) Applicant: SAMSUNG ELECTRONICS CO., LTD., Suwon-si (KR)

(72) Inventors: Youngsang Cho, Seongnam-si (KR); Heeseok Lee, Suwon-si (KR); Yunhyeok Im, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 847 days.

(21) Appl. No.: 17/952,841

(22) Filed: Sep. 26, 2022

(65) Prior Publication Data

US 2023/0207417 A1 Jun. 29, 2023

(30) Foreign Application Priority Data

Dec. 28, 2021 (KR) ........................ 10-2021-0189554

(51) Int. Cl.
*H10W 40/22* (2026.01)
*H10W 40/25* (2026.01)
(Continued)

(52) U.S. Cl.
CPC ......... *H10W 40/22* (2026.01); *H10W 40/258* (2026.01); *H10W 70/65* (2026.01); (Continued)

(58) Field of Classification Search
CPC . H01L 23/3675; H01L 23/13; H01L 23/3135; H01L 23/315; H01L 23/3736; H01L 23/49816; H01L 23/49822; H01L 23/49833; H01L 23/49838; H01L 24/16; H01L 25/105; H01L 24/32; H01L 24/48; H01L 2224/16227; H01L 2224/32145; H01L 2224/32225; H01L 2224/48227; H01L 2225/1023; H01L 2225/1041;
(Continued)

(56) References Cited

U.S. PATENT DOCUMENTS 9,029,998 B2 5/2015 Jang et al.
9,343,535 B2 5/2016 Lee et al.
(Continued)

FOREIGN PATENT DOCUMENTS

KR 10-2005-0076470 A 7/2005

*Primary Examiner* — Zandra V Smith
*Assistant Examiner* — Corbyn D Mellinger
(74) *Attorney, Agent, or Firm* — Fish & Richardson P.C.

(57) ABSTRACT

A semiconductor package includes a first interconnection structure, a first semiconductor chip on the first interconnection structure, an encapsulant covering the first semiconductor chip, a second interconnection structure on the first semiconductor chip and the encapsulant, including a plurality of interconnection layers, and having an opening having a step portion, exposing a portion of an upper surface of at least one of the plurality of interconnection layers, and a heat dissipation pattern in the opening, passing through the encapsulant and in contact with at least a portion of an upper surface of the first semiconductor chip. The heat dissipation pattern includes a lower portion having a first width, and an upper portion on the lower portion and having a second width, and the upper portion of the heat dissipation pattern contacts the exposed portion of the upper surface of the at least one interconnection layer.

20 Claims, 12 Drawing Sheets

(51) Int. Cl.

| | |
|---|---|
| ***H10W 70/65*** | (2026.01) |
| ***H10W 70/68*** | (2026.01) |
| ***H10W 70/685*** | (2026.01) |
| ***H10W 74/10*** | (2026.01) |
| ***H10W 90/00*** | (2026.01) |
| *H10W 70/60* | (2026.01) |
| *H10W 74/00* | (2026.01) |
| *H10W 90/20* | (2026.01) |

(52) U.S. Cl.

CPC ......... *H10W 70/68* (2026.01); *H10W 70/685* (2026.01); *H10W 74/121* (2026.01); *H10W 74/124* (2026.01); *H10W 90/00* (2026.01); *H10W 90/401* (2026.01); *H10W 90/701* (2026.01); *H10W 70/60* (2026.01); *H10W 74/00* (2026.01); *H10W 90/288* (2026.01); *H10W 90/722* (2026.01); *H10W 90/724* (2026.01); *H10W 90/732* (2026.01); *H10W 90/734* (2026.01); *H10W 90/754* (2026.01)

(58) Field of Classification Search

CPC ..... H01L 2225/1058; H01L 2225/1094; H01L 2924/1431; H01L 2924/1434; H01L 2924/1811; H01L 2924/182; H01L 2924/3511; H01L 23/49811; H01L 24/81; H01L 23/3128; H01L 23/3677; H01L 23/367; H01L 23/3107; H01L 23/5389; H10W 40/22; H10W 40/258; H10W 70/65; H10W 70/68; H10W 70/685; H10W 74/121; H10W 74/124; H10W 90/00; H10W 90/401; H10W 90/701

See application file for complete search history.

(56) References Cited

U.S. PATENT DOCUMENTS

| | | | | |
|---|---|---|---|---|
| 9,502,342 | B2 | 11/2016 | Kim | |
| 9,620,484 | B2 | 4/2017 | Kim | |
| 10,971,422 | B2 | 4/2021 | Kinsley | |
| 10,971,426 | B2 | 4/2021 | Yoo | |
| 2003/0116851 | A1 | 6/2003 | Sett et al. | |
| 2015/0115466 | A1* | 4/2015 | Kim | H01L 23/28 257/774 |
| 2015/0194362 | A1* | 7/2015 | Otremba | H01L 23/367 257/676 |
| 2016/0372448 | A1 | 12/2016 | Yazdani | |
| 2020/0144192 | A1* | 5/2020 | Choi | H01L 23/3128 |
| 2020/0373487 | A1* | 11/2020 | Wang | H10N 70/826 |
| 2021/0272880 | A1* | 9/2021 | Lee | H01L 23/3128 |

* cited by examiner

SEMICONDUCTOR PACKAGE

CROSS-REFERENCE TO RELATED APPLICATION(S)

This application claims the benefit under 35 USC 119(a) of Korean Patent Application No. 10-2021-0189554 filed on Dec. 28, 2021 in the Korean Intellectual Property Office, the entire disclosure of which is incorporated herein by reference for all purposes.

BACKGROUND

The present inventive concept relates to a semiconductor package.

As semiconductor chips are miniaturized and become further integrated, there is a need for a heat dissipation system capable of effectively dissipating heat generated by a semiconductor chip of the semiconductor package externally.

SUMMARY

Exemplary embodiments provide a semiconductor package having an improved heat dissipation performance.

According to exemplary embodiments, a semiconductor package includes a first interconnection structure; a first semiconductor chip disposed on the first interconnection structure; an encapsulant covering the first semiconductor chip; a second interconnection structure disposed on the first semiconductor chip and the encapsulant, including a plurality of interconnection layers, and having an opening having a step portion, exposing a portion of an upper surface of at least one interconnection layer among the plurality of interconnection layers; and a heat dissipation pattern disposed in the opening of the second interconnection structure, passing through the encapsulant and in contact with at least a portion of an upper surface of the first semiconductor chip, and including a material having thermal conductivity higher than the thermal conductivity of silicon (Si). The heat dissipation pattern includes a lower portion having a first width, and an upper portion disposed on the lower portion and having a second width greater than the first width, and the upper portion of the heat dissipation pattern is in contact with the exposed portion of the upper surface of the at least one interconnection layer.

According to exemplary embodiments, a semiconductor package includes a first interconnection structure; a first semiconductor chip disposed on the first interconnection structure; an encapsulant covering the first semiconductor chip and having a first opening exposing at least a portion of an upper surface of the first semiconductor chip; a second interconnection structure disposed on the first semiconductor chip and the encapsulant, including a plurality of interconnection layers, and having a second opening provided with a step portion, exposing a portion of an upper surface of a lowermost interconnection layer among the plurality of interconnection layers; a third interconnection structure on the second interconnection structure; and a heat dissipation pattern disposed in the first opening and the second opening, in contact with at least a portion of the upper surface of the first semiconductor chip, and including a material having a thermal conductivity higher than the thermal conductivity of silicon (Si). The heat dissipation pattern is spaced apart from the third interconnection structure and is in contact with a portion of the exposed upper surface of the lowermost interconnection layer in the second opening of the second interconnection structure.

According to exemplary embodiments, a semiconductor package includes a semiconductor chip; a heat dissipation pattern disposed on the semiconductor chip and including a material having a thermal conductivity higher than the thermal conductivity of silicon (Si); and a interconnection layer disposed to surround the heat dissipation pattern. The heat dissipation pattern has a bottom surface in contact with an upper surface of the semiconductor chip, a first surface in contact with a side surface of the interconnection layer, a second surface in contact with an upper surface of the interconnection layer, and a third surface overlapping the interconnection layer in a direction, perpendicular to the upper surface of the interconnection layer.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION OF THE PROFFERED EMBODIMENTS

Hereinafter, exemplary embodiments will be described with reference to the accompanying drawings.

Figure 1:
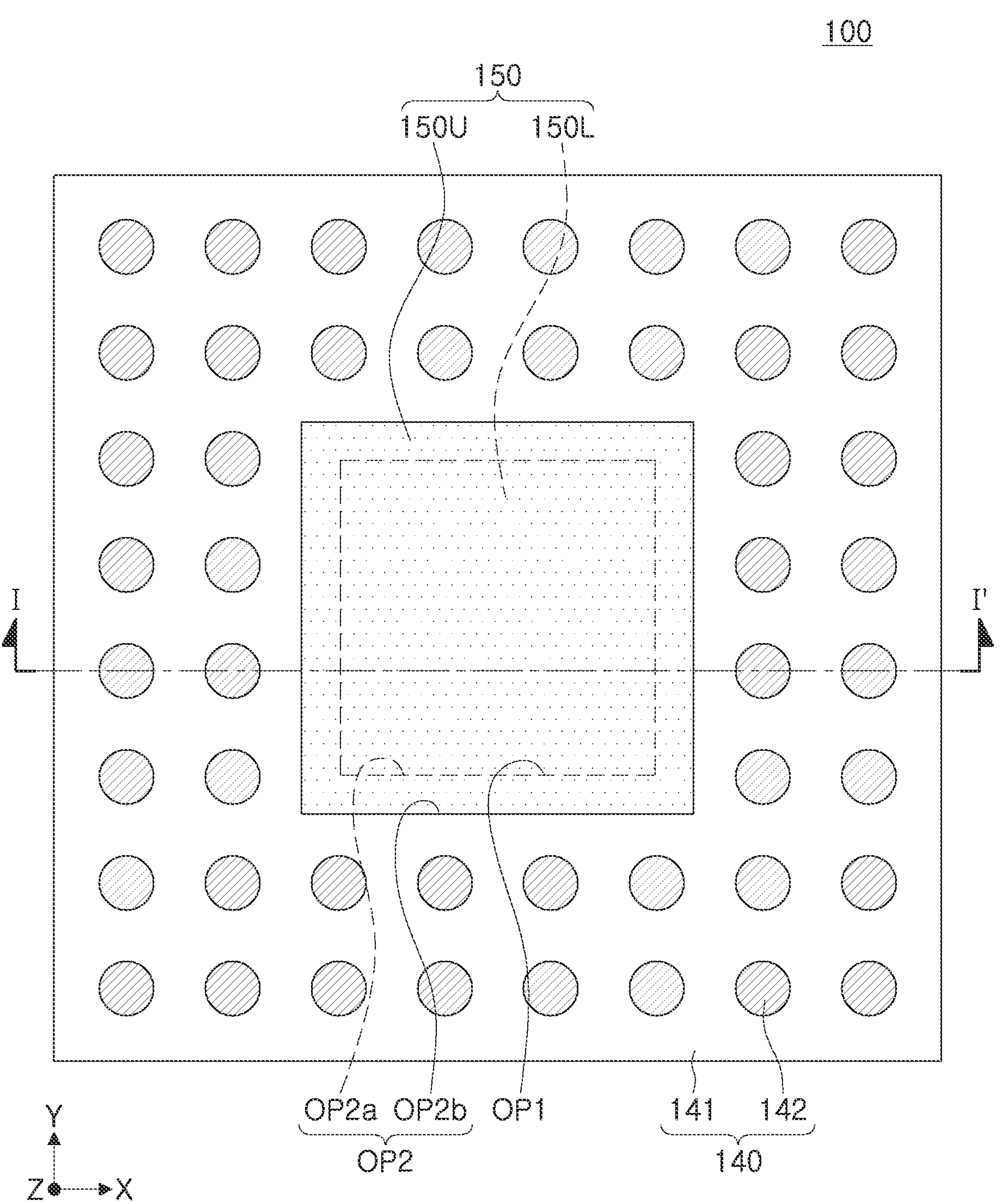
FIG. 1 is a schematic plan view of a semiconductor package according to an exemplary embodiment.

FIG. 1 is a schematic plan view of a semiconductor package according to an exemplary embodiment.

Figure 2:
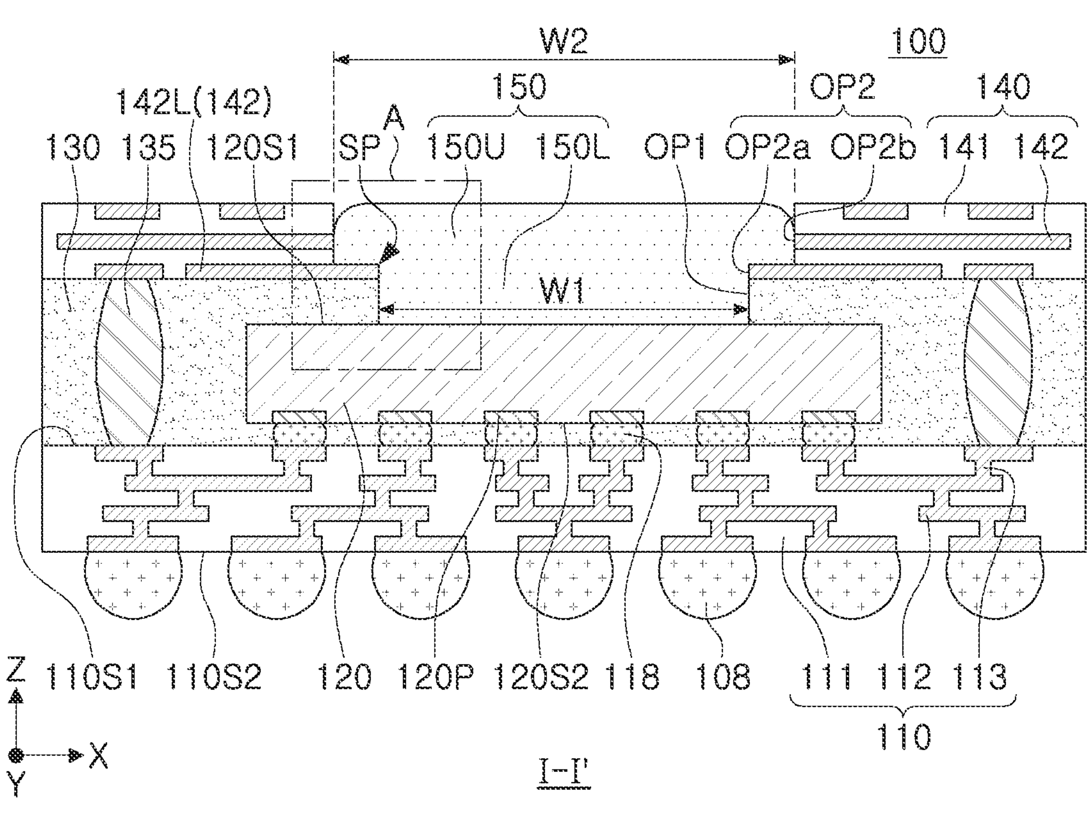
FIG. 2 is a schematic cross-sectional view of a semiconductor package according to an exemplary embodiment.

FIG. 2 is a schematic cross-sectional view of a semiconductor package according to an exemplary embodiment. FIG. 2 is a cross-sectional view of the semiconductor package of FIG. 1 taken along line I-I'.

Figure 3:
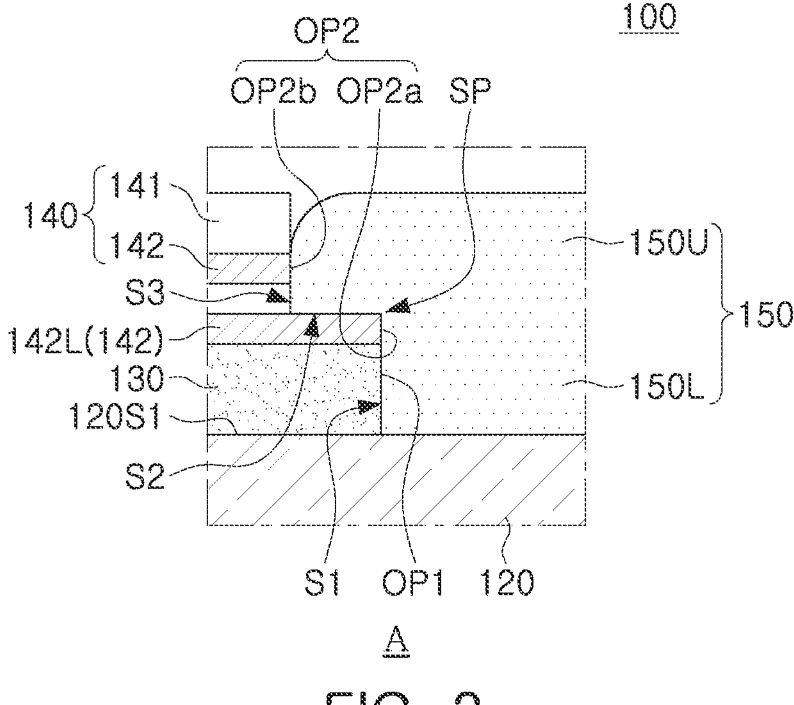
FIG. 3 is a partially enlarged view illustrating a portion of a semiconductor package according to an exemplary embodiment.

FIG. 3 is a partially enlarged view illustrating a portion of a semiconductor package according to an exemplary embodiment. FIG. 3 is an enlarged view of area 'A' of FIG. 2.

Referring to FIGS. 1 to 3, a semiconductor package 100 according to an exemplary embodiment may include a first interconnection structure 110, a first semiconductor chip 120 on the first interconnection structure 110, a first encapsulant 130 covering the first semiconductor chip 120, a second interconnection structure 140 on the first encapsulant 130, and a heat dissipation pattern 150 passing through the first encapsulant 130 and the second interconnection structure 140 and contacting the first semiconductor chip 120. The heat dissipation pattern 150 may be a heat spreader, and may serve to radiate heat generated in the first semiconductor chip 120 externally. In relation to the first semiconductor chip 120, the heat dissipation pattern 150 may directly contact the first semiconductor chip 120 without a heat transfer material layer interposed therebetween.

The first interconnection structure 110 may be, for example, a substrate for a semiconductor package, including a printed circuit board (PCB), a ceramic substrate, a glass substrate, a tape interconnection board, or the like. The first interconnection structure 110 may include, for example, an interposer or a redistribution structure including redistribution layers. The first interconnection structure 110 may include a first insulating layer 111, first interconnection layers 112, and first vias 113.

The first insulating layer 111 may include silicon oxide, silicon nitride, silicon oxynitride, or tetraethylorthosilicate (TEOS). The first insulating layer 111 may include a photosensitive resin such as photoimageable dielectric (PID) or photosensitive polyimide (PSPI). The first insulating layer 111 may include FR-4, glass, ceramic, epoxy resin, phenol resin, urethane resin, silicone resin, polyimide resin, or the like. The first insulating layer 111 may be a single layer or may include a plurality of layers.

The first interconnection layers 112 and the first vias 113 may include a metal material such as, for example, copper (Cu), aluminum (Al), silver (Ag), tin (Sn), gold (Au), nickel (Ni), lead (Pb) or titanium (Ti), a nitride of the metal material, or an alloy of the metal materials. The first vias 113 may electrically connect the first interconnection layers 112 disposed at different levels with respect to each other. The first interconnection layers 112 and the first vias 113 may be formed in a multilayer structure in the first interconnection structure 110, and the number of stacked layers is not limited to those illustrated, and may be modified according to exemplary embodiments. First connection bumps 108 may be electrically connected to second interconnection layers 142 through the first interconnection layers 112, the first vias 113, and a vertical connection structure 135.

The semiconductor package 100 may further include first connection bumps 108 disposed below the lower surface of the first interconnection structure 110 and be electrically connected to the first interconnection layers 112. The first connection bumps 108 may be electrically connected to first connection pads 120P of the first semiconductor chip 120 through the first interconnection layers 112 and the first vias 113.

The first connection bumps 108 may include a low-melting-point metal, for example, or an alloy (e.g., Sn—Ag—Cu) including, for example, tin (Sn). The first connection bumps 108 may include, for example, tin (Sn), indium (In), bismuth (Bi), antimony (Sb), copper (Cu), silver (Ag), zinc (Zn), lead (Pb) and/or alloys thereof. The alloys may be, for example, Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, Sn—Bi—Zn, or the like. The first connection bumps 108 may include, for example, solder balls. Each of the first connection bumps 108 may have a land, ball, or pin shape. Each of the first connection bumps 108 may be formed as a multi-layer or a single layer. The first connection bumps 108 may physically and/or electrically connect the semiconductor package 100 to an external source.

The first semiconductor chip 120 may include first connection pads 120P disposed on an upper surface 110S1 of the first interconnection structure 110 and electrically connected to the first interconnection layers 112 of the first interconnection structure 110. For example, the first semiconductor chip 120 may be disposed such that the first connection pads 120P and a lower surface 120S2 that is an active surface, faces the first interconnection structure 110. The first connection pads 120P may include a metal material such as aluminum (Al) or the like. The first semiconductor chip 120 may have an active surface on which integrated circuits are disposed in a region adjacent to the lower surface 120S2.

The first semiconductor chip 120 may be a logic chip or a memory chip. The logic chip may include, for example, a central processing unit (CPU), a graphics processing unit (GPU), a field programmable gate array (FPGA), a digital signal processor (DSP), a cryptographic processor, a microprocessor, a microcontroller, an analog-to-digital converter, an application-specific integrated circuit (ASIC), and the like. The memory chip may include a volatile memory device such as a dynamic random access memory (DRAM), a static RAM (SRAM), or the like, or a non-volatile memory device such as a phase change RAM (PRAM), a magnetic RAM (MRAM), a resistive RAM (RRAM), a flash memory, and the like. In another embodiment, the first semiconductor chip 120 may include stacked semiconductor chips used in high bandwidth memory (HBM) products. In this case, some of the stacked semiconductor chips may include a through silicon via (TSV).

The first semiconductor chip 120 is illustrated as one chip disposed on the first interconnection structure 110, but the present inventive concept is not limited thereto, and the first semiconductor chip 120 may include a plurality of stacked semiconductor chips. In such a case, at least some of the plurality of semiconductor chips may include the through silicon via, and may be directly bonded through bonding pads or connected to each other through connection bumps interposed therebetween. In an example, the plurality of semiconductor chips may include a first semiconductor chip and a second semiconductor chip having different widths.

The semiconductor package 100 may further include second connection bumps 118 for electrically connecting the first connection pads 120P of the first semiconductor chip 120 to the first interconnection layers 112 of the first interconnection structure 110.

The second connection bumps 118 may have a smaller size than the first connection bumps 108, and may be disposed between the first interconnection structure 110 and the first semiconductor chip 120. Since the second connection bumps 118 are similar to the first connection bumps 108, their description will be omitted as redundant. The first semiconductor chip 120 may be mounted on the first interconnection structure 110 by a flip-chip bonding method by the second connection bumps 118. The semiconductor package 100 may further include an underfill resin (not illustrated) surrounding at least a portion of the second connection bumps 118. In another embodiment, the first semiconductor chip 120 may be directly connected to the first interconnection structure 110 without the second connection bumps 118.

The first encapsulant 130 may be disposed on the first interconnection structure 110 and may cover the first semiconductor chip 120. The first encapsulant 130 may seal at least a portion of a side surface and an upper surface of the first semiconductor chip 120. The first encapsulant 130 may include an insulating material, for example, a thermosetting resin such as an epoxy resin, a thermoplastic resin such as polyimide, or Ajinomoto Build-up Film (ABF), FR-4, Bismaleimide Triazine (BT), Epoxy Molding Compound (EMC) or a prepreg including an inorganic filler and/or glass fiber.

The first encapsulant 130 may include a first opening OP1 connected to a second opening OP2 of the second interconnection structure 140 and exposing at least a portion of an upper surface 120S1 that is the inactive surface of the first semiconductor chip 120. The first opening OP1 may have a first width W1 that is less than a second width W2 that is a maximum width of the second opening OP2. In the first opening OP1, the heat dissipation pattern 150 may contact the first encapsulant 130. The first opening OP1 of the first encapsulant 130 may be a single opening penetrating through the first encapsulant 130 on the first semiconductor chip 120.

The semiconductor package 100 may further include a vertical connection structure 135 disposed in the via hole of the first encapsulant 130. The vertical connection structure 135 may be disposed to be spaced apart from the side surface of the first semiconductor chip 120, and may be a structure for electrically connecting the first interconnection structure 110 and the second interconnection structure 140 to each other. The via hole of the first encapsulant 130 may be formed by performing a laser drilling process or an etching process. In another embodiment, the semiconductor package 100 may further include a frame having a through hole in which the first semiconductor chip 120 is mounted, instead of the vertical connection structure 135. The frame may include a plurality of insulating layers, a plurality of via patterns, and a plurality of metal patterns.

The second interconnection structure 140 may be, for example, a substrate for a semiconductor package, including a printed circuit board (PCB), a ceramic substrate, a glass substrate, a tape interconnection board, or the like. The second interconnection structure 140 may include, for example, an interposer. The second interconnection structure 140 may include a second insulating layer 141, second interconnection layers 142, and second vias (not illustrated). The second vias may be disposed between the second interconnection layers 142 disposed at different levels to electrically connect the second interconnection layers 142 to each other.

The second insulating layer 141 may include silicon oxide, silicon nitride, silicon oxynitride, or tetraethylorthosilicate (TEOS). The second insulating layer 141 may include a photosensitive resin such as photoimageable dielectric (PID) or photosensitive polyimide (PSPI). The second insulating layer 141 may include FR-4, glass, ceramic, epoxy resin, phenol resin, urethane resin, silicone resin, polyimide resin, or the like. The second insulating layer 141 may be a single layer or may include a plurality of layers.

The second interconnection layers 142 may include a metal material such as, for example, copper (Cu), aluminum (Al), silver (Ag), tin (Sn), gold (Au), nickel (Ni), lead (Pb), or titanium (Ti), a nitride of the metal material, or an alloy of the metal materials. The second interconnection layers 142 may be formed in a multilayer structure in the first interconnection structure 110, and the number of stacked layers is not limited to the illustration and may vary according to exemplary embodiments. For example, the second interconnection layers 142 may include a ground (GrouND: GND) pattern, a power (PoWeR: PWR) pattern, and a signal (S) pattern. The signal (S) pattern may include various signals other than a ground (GND) pattern and a power (PWR) pattern, for example, it may include a data signal.

The second interconnection structure 140 may include the second opening OP2 connected to the first opening OP1 of the first encapsulant 130. The second opening OP2 of the second interconnection structure 140 may be a single opening passing through the second interconnection structure 140. A step portion SP exposing a portion of an upper surface of at least one of the second interconnection layers 142, for example, a portion of an upper surface of a lowermost second interconnection layer 142L, may be provided in the second opening OP2. In an example, the second interconnection layer 142 having an upper surface exposed by the step portion SP of the second opening OP2 may be a second interconnection layer 142 disposed on a different level from the lowermost second interconnection layer 142L. As illustrated in FIG. 3, based on the step portion SP, the second opening OP2 may include a first region OP2*a* and a second region OP2*b* on the first region OP2*a*. The second region OP2*b* may have the second width W2 that is greater than the first width W1 of the first opening OP1 of the first encapsulant 130, and the first region OP2*a* may have substantially the same width as the first width W1 of the first opening OP1 of the first encapsulant 130. In an exemplary embodiment, the first width W1 may be greater than or equal to about 0.8 times and less than about one time the second width W2.

For example, the lowermost second interconnection layer 142L having an upper surface exposed by the step portion SP of the second opening OP2 may be disposed in a form surrounding the first region OP2*a* of the second opening OP2 and a lower portion 150L of the heat dissipation pattern 150. The lowermost second interconnection layer 142L may have an outer side surface that extends outwardly more than the outer side surface of the heat dissipation pattern 150 while enclosing an edge of the lower portion 150L of the heat dissipation pattern 150. Since the lowermost second interconnection layer 142L contacts an upper portion 150U of the heat dissipation pattern 150, a heat dissipation area by the heat dissipation pattern 150 may be enlarged. In detail, not only does the heat dissipation pattern 150, but also the lowermost second interconnection layer 142L in contact with the heat dissipation pattern 150 serves as a heat spreader, and thus, heat may be radiated over a larger area to improve heat dissipation efficiency.

The heat dissipation pattern 150 may pass through the first encapsulant 130 and the second interconnection structure 140 to contact at least a portion of the upper surface 120S1 of the first semiconductor chip 120. The heat dissipation pattern 150 may not come into contact with other components (e.g., the third interconnection structure 210 of FIG. 6) disposed thereon. Since the heat dissipation pattern 150 is in direct contact with the first semiconductor chip 120 without a heat transfer material layer, there is no need to form a further structure for dissipating heat thereon.

The heat dissipation pattern 150 may have, for example, a rivet shape. The heat dissipation pattern 150 may include the lower portion 150L and the upper portion 150U on the lower portion 150L. The upper portion 150U and the lower portion 150L may have different widths. For example, the second width W2 of the upper portion 150U may be greater than the first width W1 of the lower portion 150L. The lower portion 150L may be disposed in the first region OP2*a* of the first opening OP1 and the second opening OP2, and the upper portion 150U may be disposed in the second region OP2*b* of the second opening OP2. The side surface of the heat dissipation pattern 150 may include a bent portion due to a difference between the first width W1 and the second width W2. For example, the heat dissipation pattern 150 may have a bottom surface contacting the upper surface 120S1 of the first semiconductor chip 120, a first surface S1 contacting a side surface of the lowermost second interconnection layer 142L, a second surface S2 in contact with the upper surface of the lowermost interconnection layer 142L, and a third surface S3 overlapping the lowermost second interconnection layer 142L in the Z direction. The bottom surface of the heat dissipation pattern 150 may be located on a level lower than that of the second surface S2.

The heat dissipation pattern 150 may include a material having higher thermal conductivity than silicon (Si). The heat dissipation pattern 150 may be formed of, for example, at least one of copper (Cu), nickel (Ni), aluminum (Al), silver (Ag), and gold (Au). The heat dissipation pattern 150 does not include particles or powder of a conductive material in the resin, but may include a single metal material or a plurality of metal materials of copper (Cu), nickel (Ni), aluminum (Al), silver (Ag), and gold (Au). The heat dissipation pattern 150 may not include a resin. The heat dissipation pattern 150 may include, for example, graphene. The heat dissipation pattern 150 may include the same material as the lowermost second interconnection layer 142L. When the heat dissipation pattern 150 is formed of Cu, the heat dissipation pattern 150 may include a barrier layer formed of Al and a conductive layer formed of Cu. In this case, the barrier layer may serve to prevent diffusion of Cu elements of the conductive layer into the first semiconductor chip 120. The barrier layer is not limited to the Al material and may include other materials.

Since the material constituting the heat dissipation pattern 150 is harder than the material constituting the first encapsulant 130, the heat dissipation pattern 150 may prevent and alleviate warpage of the semiconductor package 100. In addition, since the heat dissipation pattern 150 has a rivet shape, a bonding area between the heat dissipation pattern 150 and the second interconnection structure 140 may increase, and thus, when warpage occurs in the semiconductor package 10, stress concentration between the heat dissipation pattern 150 and the interface of the second interconnection structure 140 may be relieved. Also, bonding strength between the heat dissipation pattern 150 and the second interconnection structure 140 may be improved.

As described above, since the heat dissipation pattern 150 contacts the lowest second interconnection layer 142L through the upper portion 150U, the heat dissipation area may be enlarged by the arrangement area of the lowest second interconnection layer 142L. In addition to the heat dissipation pattern 150, the lowermost second interconnection layer 142L in contact with the heat dissipation pattern 150 also serves as a heat spreader, and therefore, heat may be dissipated over a relatively larger area, thereby improving heat dissipation efficiency.

Figure 4A:
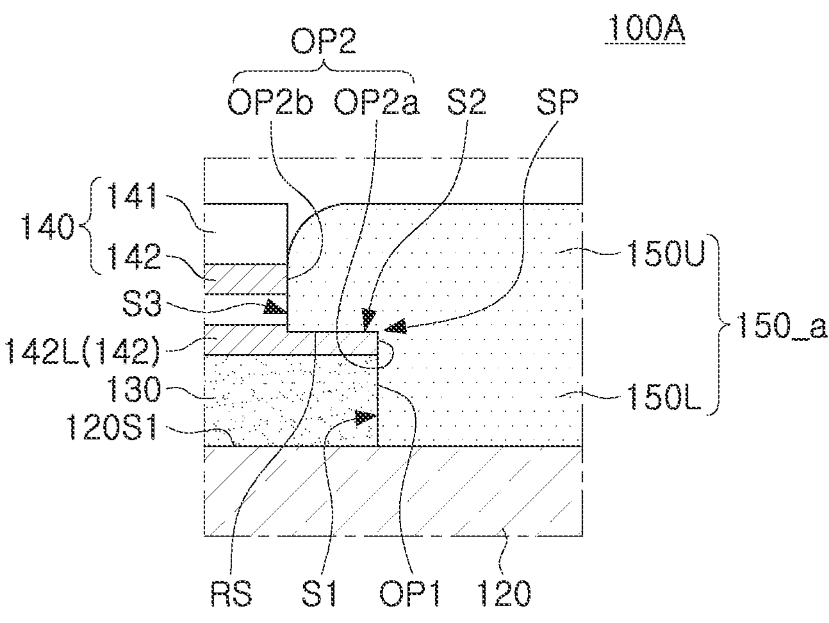
FIGS. 4A to 4C are partially enlarged views illustrating a portion of a semiconductor package according to an exemplary embodiment.
Figure 4B:
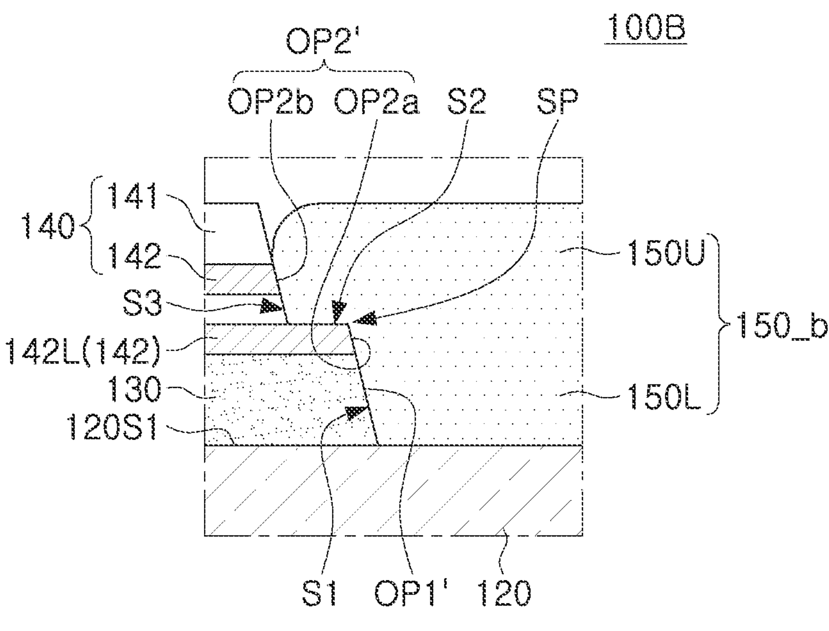
Figure 4C:
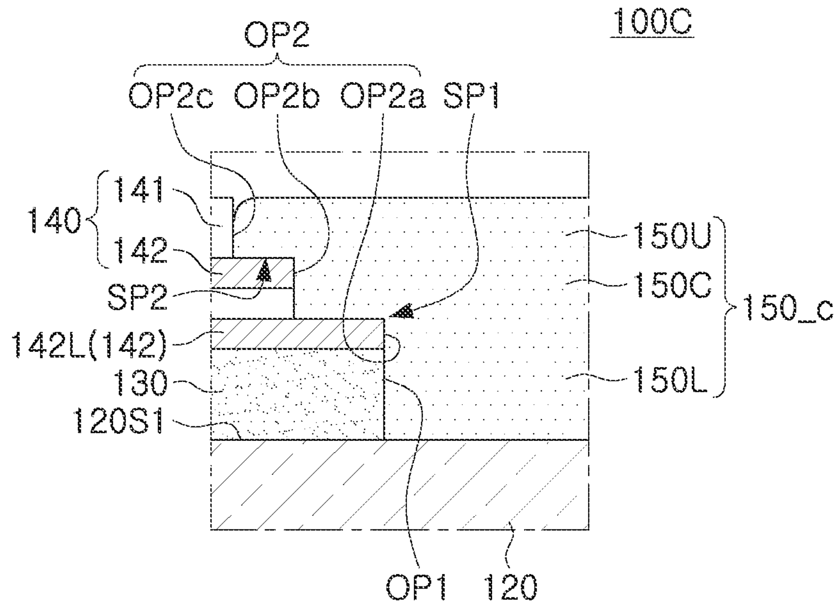

FIGS. 4A to 4C are partially enlarged views illustrating a portion of a semiconductor package according to an exemplary embodiment. FIGS. 4A to 4C illustrate an area corresponding to area ‘A’ in FIG. 2.

Referring to FIG. 4A, in a semiconductor package 100A, the upper surface of the lowermost second interconnection layer 142L may include a recessed portion RS. An upper portion 150U of a heat dissipation pattern 150_*a* may contact the recessed portion RS. The recessed portion RS may be formed when the etching process is performed until the lowermost second interconnection layer 142L is partially removed in forming a second region OP2*b* of a second opening OP2 (refer to FIG. 8B).

Referring to FIG. 4B, in a semiconductor package 100B, a first opening OP1' and a second opening OPT may be inclined with respect to the upper surface 120S1 of the first semiconductor chip 120, respectively. For example, the first opening OP1' may have an inclined inner surface that becomes narrower toward the lower bottom, and the second opening OP2' may have an inclined inner surface such that the second openings OP2' becomes narrower toward the lower portion. The side surface of the heat dissipation pattern 150_*b* may also be inclined. By providing the inclined inner side surfaces, the bonding area between the heat dissipation pattern 150_*b* and the second interconnection structure 140 is further increased, so that stress concentration due to warpage of the semiconductor package 100B may be further alleviated, and bonding strength may also be further improved. Also, by providing inclined inner side surfaces, gap filling in the first opening OP1' and the second opening OPT may be further facilitated, and a bonding surface may be stably secured, when performing a cold spray process.

Referring to FIG. 4C, in a semiconductor package 100C, the second opening OP2 may have a plurality of step portions SP1 and SP2. On the first step portion SP1, a portion of the upper surface of the lowermost second interconnection layer 142L is exposed, and on the second step portion SP2, a portion of the upper surface of the upper second interconnection layer 142 on the lowermost second interconnection layer 142L may be exposed. The second opening OP2 may include a first region OP2*a* having the same width as the first width W1, a second region OP2*b* having a second width greater than the first width, and a third region OP2*c* having a third width greater than the second width. Depending on the shape of the second opening OP2, the heat dissipation pattern 150_*c* may also include a lower portion 150L having a first width, a middle portion 150C having a second width greater than the first width, and an upper portion 150U having a third width greater than the second width. By providing the plurality of step portions, the bonding area between the heat dissipation pattern 150_*c* and the second interconnection structure 140 is further increased, and thus, stress concentration due to warpage of the semiconductor package 100B may be further alleviated, and the bonding strength may also be further improved.

Figure 5:
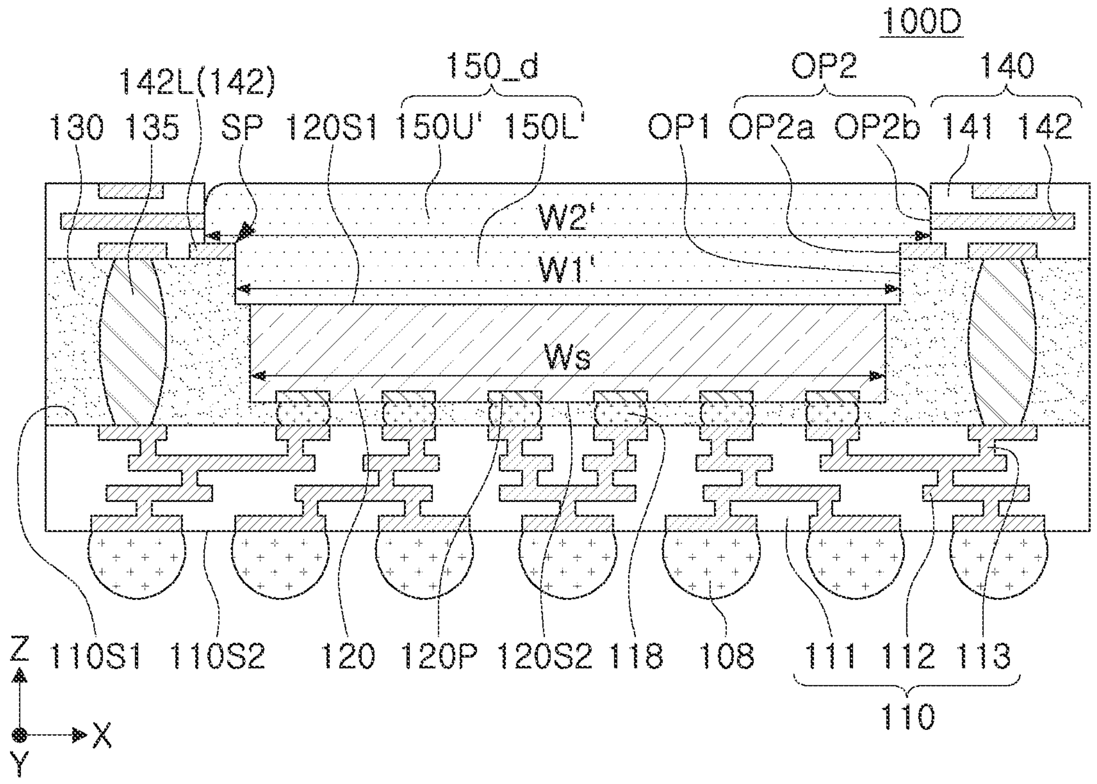
FIG. 5 is a schematic cross-sectional view of a semiconductor package according to an exemplary embodiment.

FIG. 5 is a schematic cross-sectional view of a semiconductor package according to an exemplary embodiment.

Referring to FIG. 5, in a semiconductor package 100D, a first width W1' of a lower portion 150L' of a heat dissipation pattern 150_*d* may be greater than a width Ws of the first semiconductor chip 120, and a second width W2' of an upper portion 150U' may be greater than the first width W1'. Since the heat dissipation pattern 150_*d* is disposed to have a larger area than in the previous embodiments, and contacts the upper surface of the lowermost second interconnection layer 142L through the step portion SP of the second opening OP2, heat dissipation efficiency may be improved, and stress concentration due to warpage of the semiconductor package 100D may be relieved.

Figure 6:
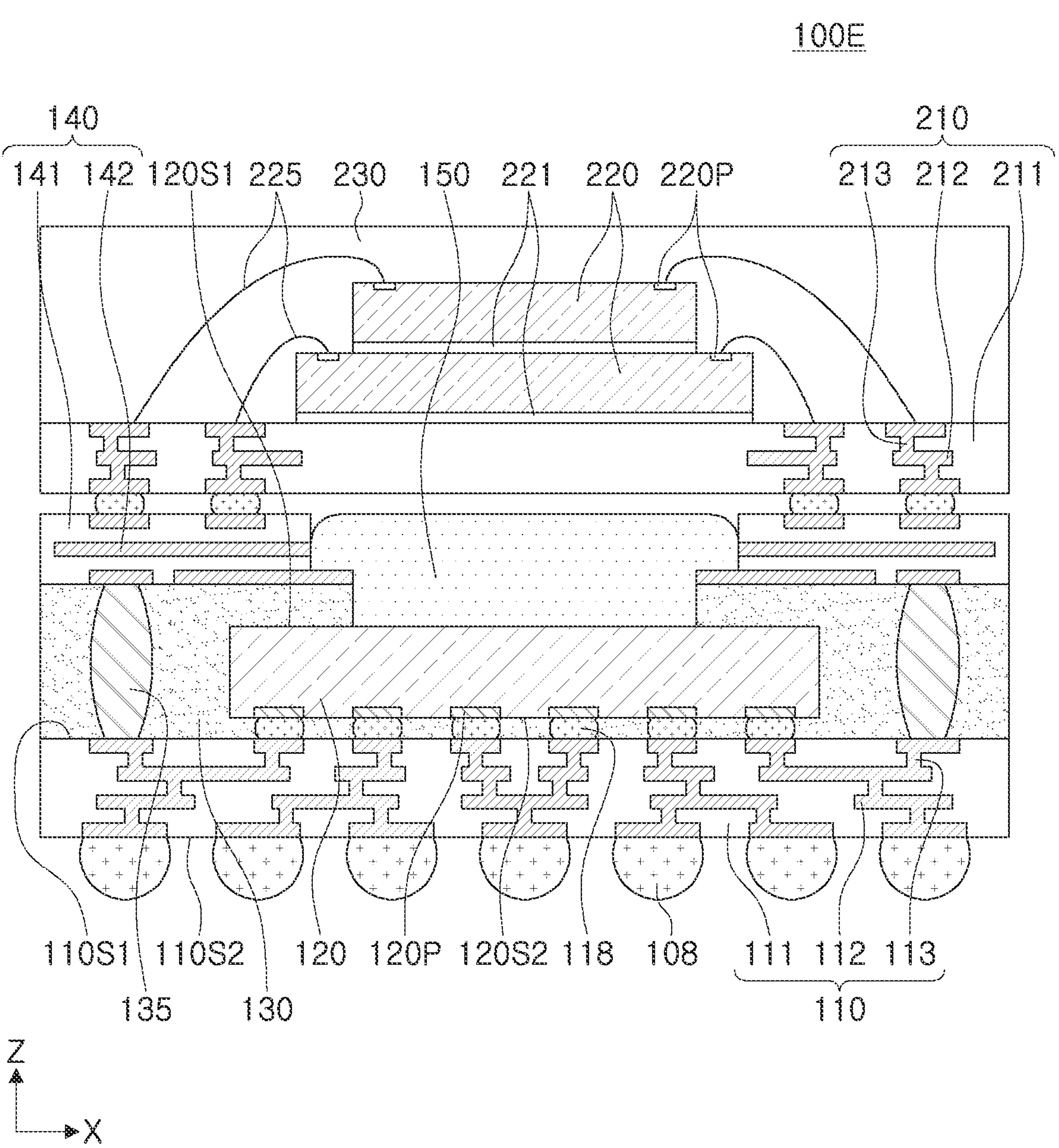
FIG. 6 is a schematic cross-sectional view of a semiconductor package according to an exemplary embodiment.

FIG. 6 is a schematic cross-sectional view of a semiconductor package according to an exemplary embodiment.

Referring to FIG. 6, a semiconductor package 100E may further include a third interconnection structure 210 on the second interconnection structure 140, third connection bumps 218 between the second interconnection structure 140 and the third interconnection structure 210, one or a plurality of second semiconductor chips 220 on the third interconnection structure 210, and a second encapsulant 230. The third interconnection structure 210 may include a third insulating layer 211, third interconnection layers 212, and third vias 213. One or a plurality of second semiconductor chips 220 may include an adhesive layer 221 disposed on a lower surface thereof. The adhesive layer 221 may adhere one or the plurality of second semiconductor chips 220 to the third interconnection structure 210, or may adhere the plurality of second semiconductor chips 220 to each other. One or the plurality of second semiconductor chips 220 may include second connection pads 220P, and may be mounted on the third interconnection structure 210 through a metal wire 225 in a wire bonding method. In some exemplary embodiments, the second semiconductor chip 220 may be mounted on the third interconnection structure 210 by a flip-chip bonding method, similar to the first semiconductor chip 120, or by a direct contact method with the third interconnection structure 210.

FIGS. 7A to 9B are views sequentially illustrating a process of manufacturing a semiconductor package according to an exemplary embodiment.

Figure 7A:
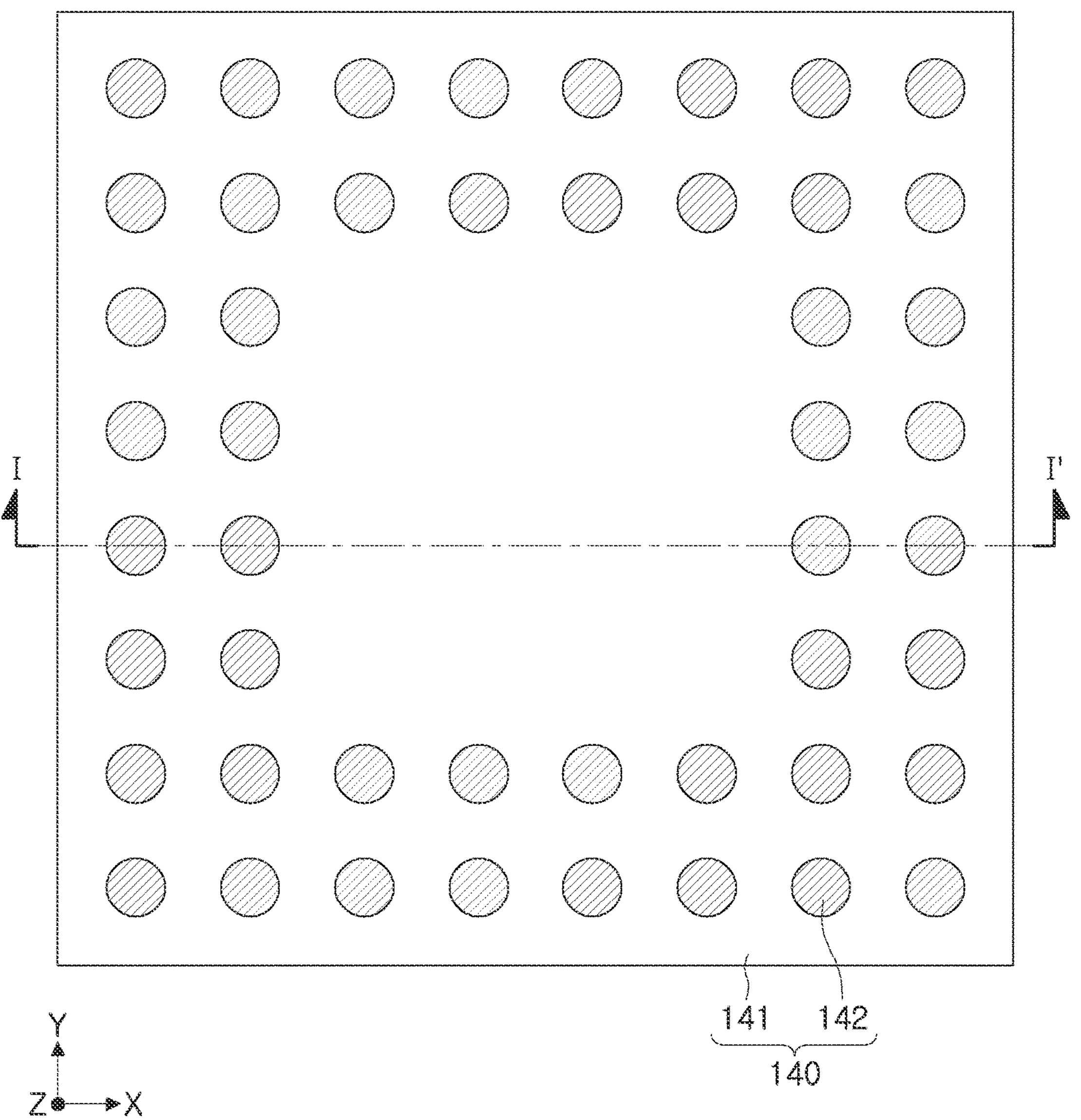
FIGS. 7A to 9B are views sequentially illustrating a process of manufacturing a semiconductor package according to an exemplary embodiment.
Figure 7B:
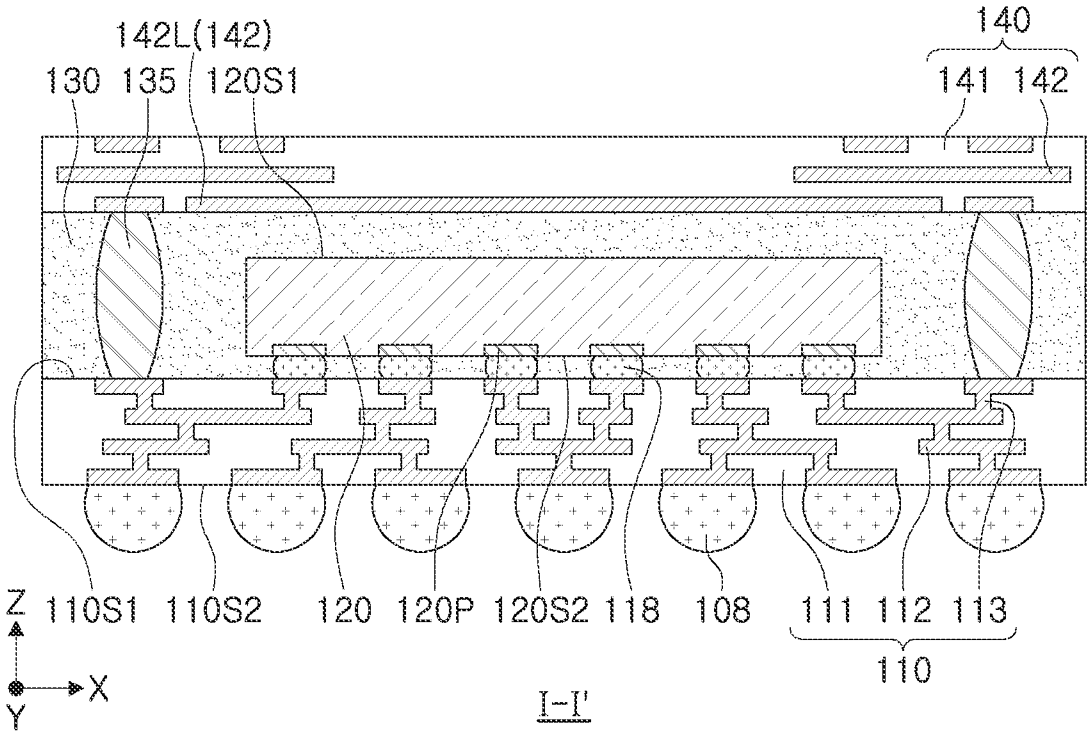

Referring to FIGS. 7A and 7B, the first structure including the first interconnection structure 110, the first semiconductor chip 120, the first connection bumps 108, the second connection bumps 118, the vertical connection structure 135, the first encapsulant 130 and the second interconnection structure 140 may be formed. The first structure is a package structure before the heat dissipation pattern 150 is formed, and may be in a state in which openings are not formed in each of the first encapsulant 130 and the second interconnection structure 140.

The first interconnection structure 110 may be prepared, and the first semiconductor chip 120 may be formed on the first interconnection structure 110. The first interconnection structure 110 may include, for example, an interposer. Forming the first interconnection structure 110 may include forming the first insulating layer 111, the first interconnection layers 112, and the first vias 113. First connection bumps 108 may be formed below the first interconnection structure 110. The first semiconductor chip 120 may be mounted on the first interconnection structure 110 by a flip-chip bonding method such that the lower surface 120S2 faces the upper surface of the first interconnection structure 110. For example, the first connection pads 120P of the first semiconductor chip 120 may be electrically connected to the first interconnection layers 112 of the first interconnection structure 110 through the second connection bumps 118.

The first encapsulant 130 may be formed on the first interconnection structure 110 to seal at least a portion of a side surface and an upper surface of the first semiconductor chip 120. The first encapsulant 130 may include holes spaced apart from the first semiconductor chip 120. A vertical connection structure 135 may be formed in the holes.

The second interconnection structure 140 may be formed on the first encapsulant 130. The second interconnection structure 140 may include, for example, an interposer. Forming the second interconnection structure 140 may include forming the second insulating layer 141 and the second interconnection layers 142. The upper second interconnection layer 142 on the lowermost second interconnection layer 142L among the second interconnection layers 142 may be formed in a square ring shape having an open center region. The lowermost second interconnection layer 142L may be formed on the first semiconductor chip 120 in the form of a plate.

Figure 8A:
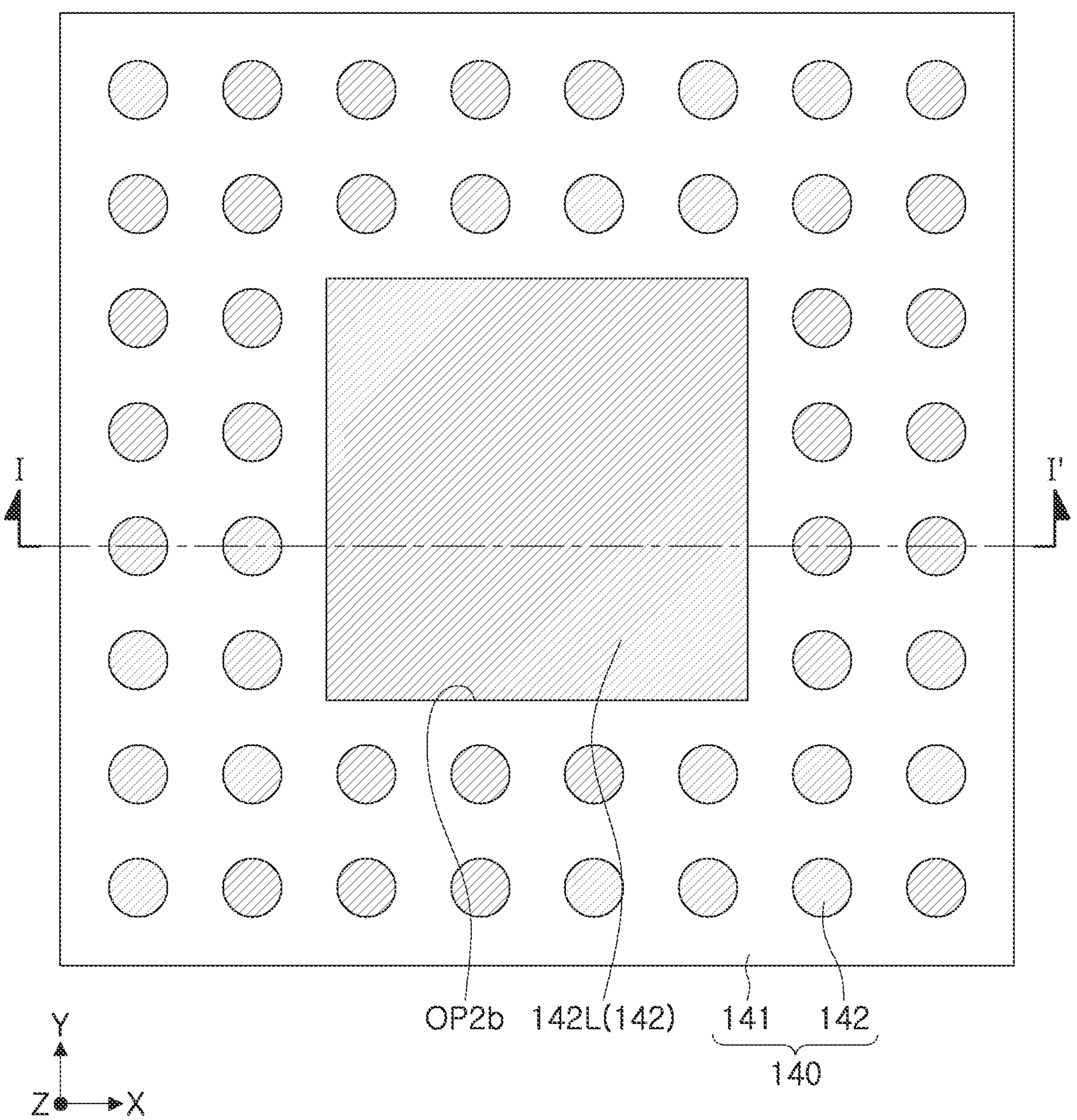
Figure 8B:
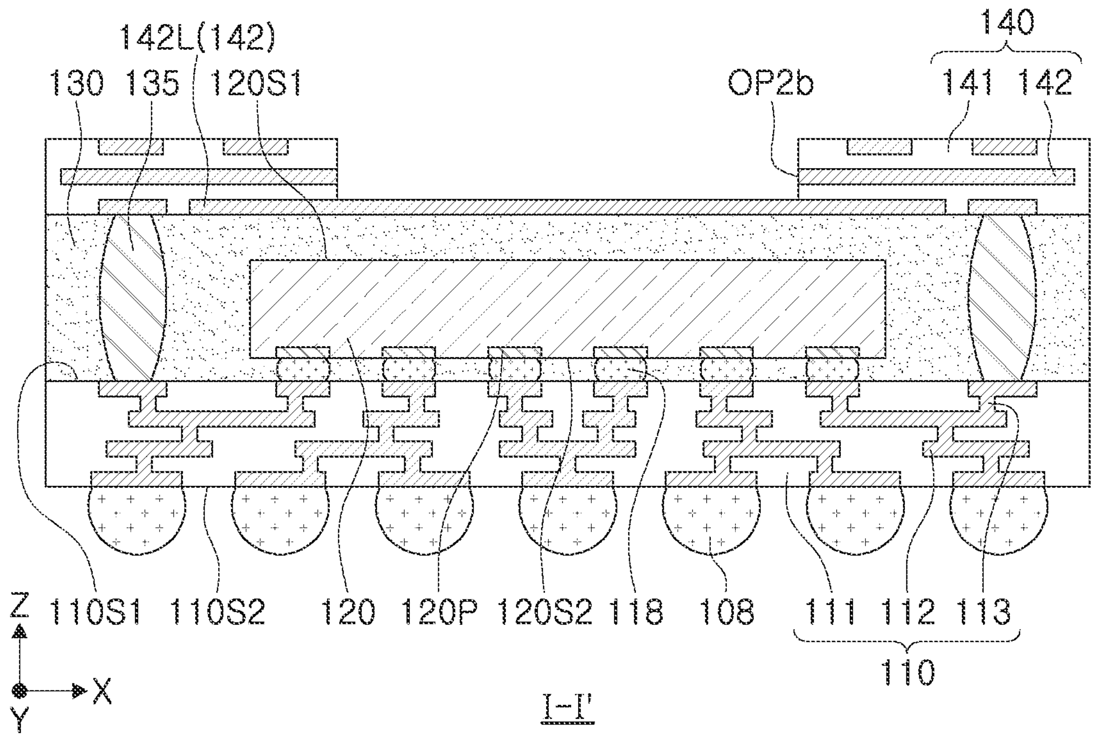

Referring to FIGS. 8A and 8B, the second interconnection structure 140 may be formed to have a partially open region such that a portion OP2*b* of the second opening OP2 may be formed. The second insulating layer 141 of the second interconnection structure 140 may be partially removed to expose an upper surface of the lowermost second interconnection layer 142L. When an etching process for forming the portion OP2*b* of the second opening OP2 is performed, the lowermost second interconnection layer 142L may serve as an etch stopper.

Figure 9A:
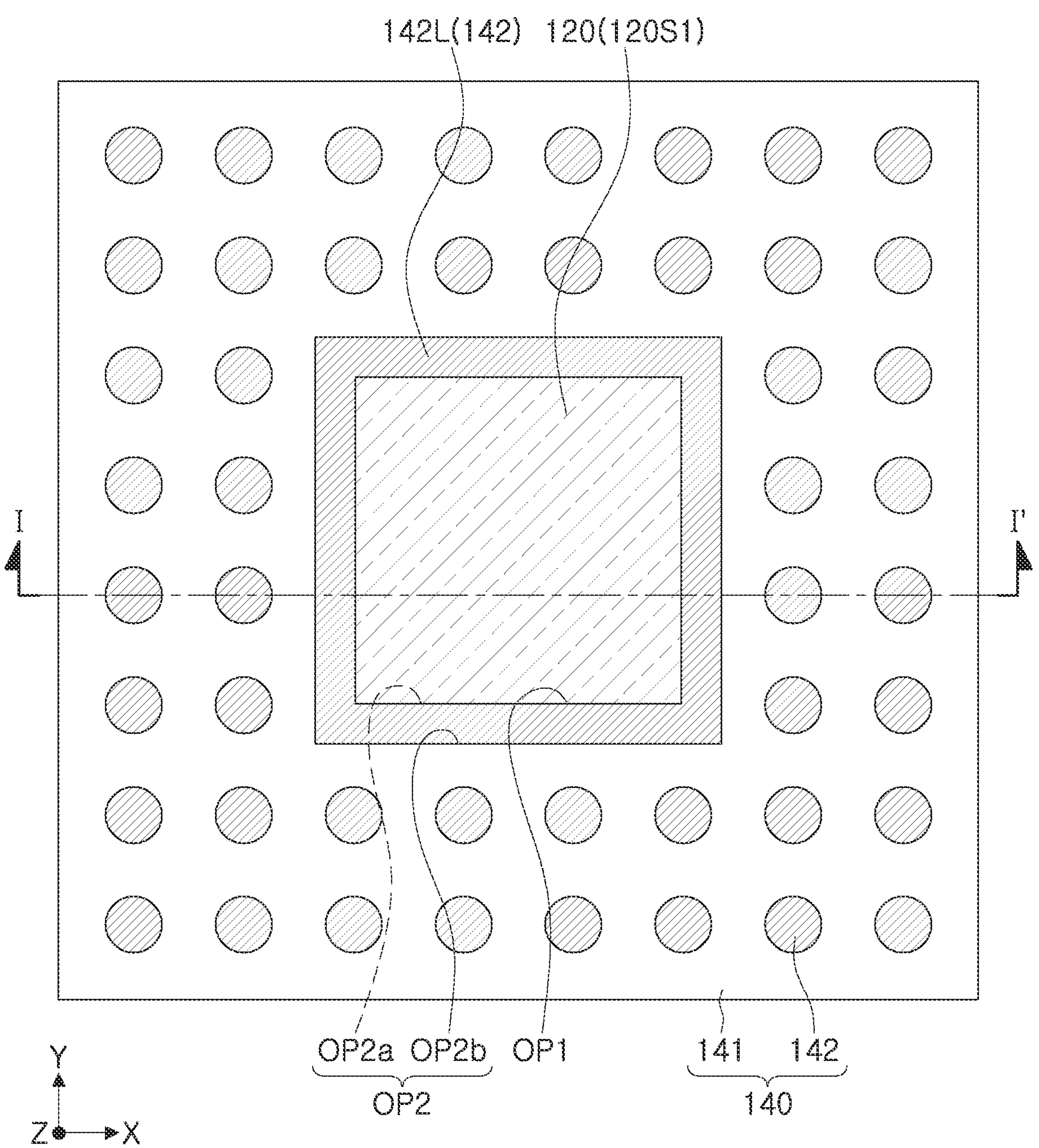
Figure 9B:
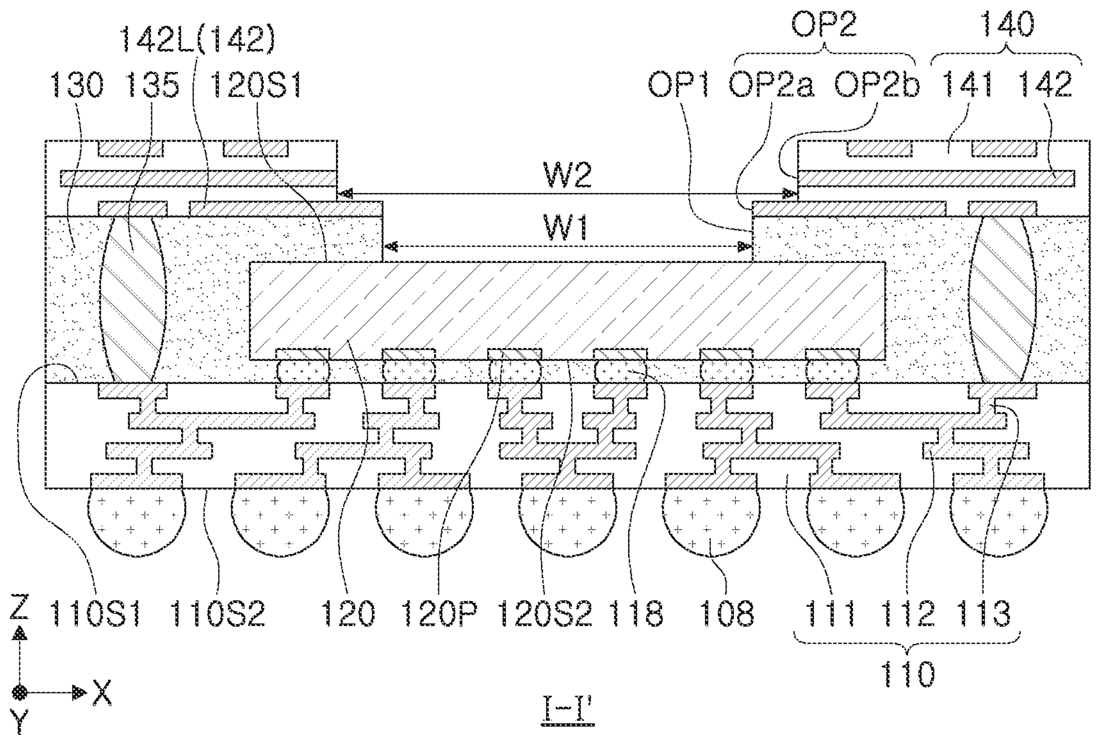

Referring to FIGS. 9A and 9B, while forming the second opening OP2 penetrating through the second interconnection structure 140, the first opening OP1 penetrating through the first encapsulant 130 may be formed. The first width W1 of the first opening OP1 may be less than the second width W2 of the second region OP2*b* of the second opening OP2. A portion of the first encapsulant 130 may be removed to expose a portion of the upper surface 120S1 of the first semiconductor chip 120. The lowermost second interconnection layer 142L may also be partially removed while forming a first region OP2*a* of the second opening OP2.

Next, referring to FIGS. 1 and 2, a heat dissipation pattern 150 may be formed in the first opening OP1 and the second opening OP2. The heat dissipation pattern 150 may be formed by, for example, by a cold spray method. The cold spray method may be a method of attaching metal powder to the substrate by discharging the metal powder together with a high-speed gas through a nozzle. The metal powder particles may be plastically deformed to be firmly fixed on the exposed surface of the first semiconductor chip 120 mounted on the interconnection structure. Accordingly, the heat dissipation pattern 150 may not require a special adhesive material, and may more effectively cover the mounted first semiconductor chip 120. The generation of heat in the semiconductor package according to the exemplary embodiments may indicate that heat is generated in the first semiconductor chip 120. For example, the heat dissipation pattern 150 is in contact with the upper surface 120S1 of the first semiconductor chip 120, and contacts the lowest second interconnection layer 142L disposed to surround the heat dissipation pattern 150, on the step portion SP of the second opening OP2. Accordingly, heat may be effectively dissipated. In addition, the cold spray method has low process costs compared to the sputtering method, and therefore, a semiconductor package having a high yield may be produced at relatively low costs.

As set forth above, the semiconductor package includes a heat dissipation pattern in contact with an upper surface of a semiconductor chip and including a material having higher thermal conductivity than silicon. The heat dissipation pattern has a rivet shape and is partially in contact with the upper surface of the interconnection layer exposed in the stepped opening of the upper interconnection structure. Since the heat dissipation pattern and the interconnection layer together serve as a heat spreader, heat generated by the semiconductor chip may be radiated externally through a relatively larger area, and thus heat dissipation performance of the semiconductor package may be improved.

While exemplary embodiments have been illustrated and described above, it will be apparent to those skilled in the art that modifications and variations could be made without departing from the scope of the present inventive concept as defined by the appended claims.

What is claimed is:

1. A semiconductor package comprising:

a first interconnection structure;

a first semiconductor chip disposed on the first interconnection structure;

an encapsulant covering the first semiconductor chip;

a second interconnection structure disposed on the first semiconductor chip and the encapsulant, the second interconnection structure including a plurality of electrical interconnection layers, and having an opening having a step portion, exposing a portion of an upper surface of at least one lowermost electrical interconnection layer among the plurality of electrical interconnection layers; and a heat dissipation pattern disposed in the opening of the second interconnection structure, passing through an opening in the encapsulant and in contact with at least a portion of an upper surface of the first semiconductor chip, and including a material having a thermal conductivity higher than thermal conductivity of silicon (Si), wherein the heat dissipation pattern includes a lower portion having a first width, and an upper portion disposed on the lower portion and having a second width greater than the first width, and wherein the upper portion of the heat dissipation pattern is in direct contact with the exposed portion of the upper surface of the at least one lowermost electrical interconnection layer.

2. The semiconductor package of claim 1, wherein a side surface of the heat dissipation pattern has a bent portion corresponding to a difference between the first width and the second width.

3. The semiconductor package of claim 1, wherein the heat dissipation pattern includes at least one of copper (Cu), nickel (Ni), aluminum (Al), silver (Ag), and gold (Au).

4. The semiconductor package of claim 1, wherein the at least one lowermost electrical interconnection layer surrounds the lower portion of the heat dissipation pattern.

5. The semiconductor package of claim 1, wherein the at least one lowermost electrical interconnection layer has an outer surface extending further outwardly than an outer surface of the heat dissipation pattern in a plan view.

6. The semiconductor package of claim 1, wherein the lower portion of the heat dissipation pattern is in contact with the encapsulant.

7. The semiconductor package of claim 1, wherein the upper surface of the at least one lowermost electrical interconnection layer includes a recessed portion, and wherein the upper portion of the heat dissipation pattern is in contact with the recessed portion of the at least one lowermost electrical interconnection layer.

8. The semiconductor package of claim 1, wherein an inner wall of the opening is inclined with respect to an upper surface of the first semiconductor chip.

9. The semiconductor package of claim 1, wherein the step portion of the opening includes a plurality of step portions sequentially exposing respective upper surfaces of the plurality of electrical interconnection layers.

10. The semiconductor package of claim 1, wherein the first width of the lower portion of the heat dissipation pattern is greater than a width of the first semiconductor chip.

11. The semiconductor package of claim 1, comprising:

a third interconnection structure on the second interconnection structure; and a second semiconductor chip disposed on the third interconnection structure.

12. A semiconductor package comprising:

a first interconnection structure;

a first semiconductor chip disposed on the first interconnection structure;

an encapsulant covering the first semiconductor chip and having a first opening exposing at least a portion of an upper surface of the first semiconductor chip;

a second interconnection structure disposed on the first semiconductor chip and the encapsulant, including a plurality of electrical interconnection layers, and having a second opening provided with a step portion, exposing a portion of an upper surface of a lowermost electrical interconnection layer among the plurality of electrical interconnection layers;

a third interconnection structure on the second interconnection structure; and a heat dissipation pattern disposed in the first opening and the second opening, in contact with at least a portion of the upper surface of the first semiconductor chip, and including a material having a thermal conductivity higher than the thermal conductivity of silicon (Si), wherein the heat dissipation pattern is spaced apart from the third interconnection structure and is in direct contact with a portion of the exposed portion of the upper surface of the lowermost electrical interconnection layer in the second opening of the second interconnection structure.

13. The semiconductor package of claim 12, wherein the first opening has a first width, and wherein the second opening has a second width on the step portion, wherein the first width is smaller than the second width.

14. The semiconductor package of claim 13, wherein the first width of the first opening is greater than a width of the first semiconductor chip.

15. The semiconductor package of claim 13, wherein the second opening includes a first region and a second region on the first region, wherein the first region has a width substantially equal to the first width of the first opening, and wherein the second region has the second width.

16. The semiconductor package of claim 12, comprising a vertical connection structure disposed in the encapsulant, between the first interconnection structure and the second interconnection structure, and spaced apart from a side surface of the first semiconductor chip.

17. A semiconductor package comprising:

a semiconductor chip;

a heat dissipation pattern disposed on the semiconductor chip and including a material having a thermal conductivity higher than thermal conductivity of silicon (Si); and an interconnection structure surrounding the heat dissipation pattern and having a plurality of electrical interconnection layers, wherein the heat dissipation pattern has a bottom surface in contact with an upper surface of the semiconductor chip, a first surface in contact with a side surface of the interconnection structure, a second surface in direct contact with an upper surface of at least one lowermost electrical interconnection layer of the plurality of electrical interconnection layers, and a third surface overlapping the at least one lowermost electrical interconnection layer in a direction perpendicular to the upper surface of the at least one lowermost electrical interconnection layer.

18. The semiconductor package of claim 17, wherein the heat dissipation pattern has a rivet-shaped cross-sectional shape, and wherein the interconnection structure has a plate shape surrounding the heat dissipation pattern.

19. The semiconductor package of claim 17, comprising an encapsulant disposed between the semiconductor chip and the interconnection structure, and in contact with the heat dissipation pattern.

20. The semiconductor package of claim 17, wherein the heat dissipation pattern does not include a resin.

* * * * *